(12) United States Patent
Kim et al.

(10) Patent No.: US 10,358,721 B2
(45) Date of Patent: Jul. 23, 2019

(54) SEMICONDUCTOR MANUFACTURING SYSTEM INCLUDING DEPOSITION APPARATUS

(71) Applicant: ASM IP Holding B.V., Almere (NL)

(72) Inventors: Dae Youn Kim, Daejeon (KR); Hie Chul Kim, Hwaseong-si (KR); Hyun Soo Jang, Daejeon (KR)

(73) Assignee: ASM IP Holding B.V., Almere (NL)

( * ) Notice: Subject to any disclaimer, the term of this patent is extended or adjusted under 35 U.S.C. 154(b) by 392 days.

(21) Appl. No.: 15/087,736

(22) Filed: Mar. 31, 2016

(65) Prior Publication Data

US 2017/0114460 A1   Apr. 27, 2017

Related U.S. Application Data

(60) Provisional application No. 62/245,150, filed on Oct. 22, 2015.

(51) Int. Cl.
| | |
|---|---|
| *C23C 16/455* | (2006.01) |
| *C23C 16/50* | (2006.01) |
| *H01L 21/02* | (2006.01) |
| *C23C 16/509* | (2006.01) |
| *H01J 37/32* | (2006.01) |

(52) U.S. Cl.
CPC ........ *C23C 16/45544* (2013.01); *C23C 16/50* (2013.01); *C23C 16/5096* (2013.01); *H01J 37/3244* (2013.01); *H01J 37/32513* (2013.01); *H01J 37/32541* (2013.01);
(Continued)

(58) Field of Classification Search
USPC ............ 118/715, 723 E; 156/345.33, 345.34
See application file for complete search history.

(56) References Cited

U.S. PATENT DOCUMENTS 4,355,937 A * 10/1982 Mack ................. H01J 37/18
414/217
4,534,816 A * 8/1985 Chen .................. H01J 37/3244
156/345.37

(Continued)

FOREIGN PATENT DOCUMENTS

CN          1669109 A      9/2005

OTHER PUBLICATIONS

First Office Action dated Nov. 21, 2018 in related Chinese Application No. 201610550317.1.

*Primary Examiner* — Rudy Zervigon
(74) *Attorney, Agent, or Firm* — Knobbe Martens Olson & Bear LLP (57) ABSTRACT

Provided is a semiconductor manufacturing system having an increased process window for stably and flexibly performing a deposition process. The semiconductor manufacturing system includes a gas supply device functioning as a first electrode and including a plurality of injection holes, a reactor wall connected to the gas supply device, and a substrate accommodating device functioning as a second electrode, the substrate accommodating device and the reactor wall being configured to be sealed together via face sealing. A reaction gas supplied from the gas supply device toward the substrate accommodating device is discharged to the outside through a gas discharge path between the gas supply device and the reactor wall. The first electrode includes a protruded electrode adjacent to an edge of the gas supply device.

21 Claims, 10 Drawing Sheets

(52) U.S. Cl.
CPC .. *H01J 37/32568* (2013.01); *H01J 37/32899* (2013.01); *H01L 21/02164* (2013.01); *H01L 21/02274* (2013.01)

(56) References Cited

U.S. PATENT DOCUMENTS

| | | | | |
|---|---|---|---|---|
| 4,590,042 A * | 5/1986 | Drage | H01J 37/3244 | 156/345.34 |
| 4,786,359 A * | 11/1988 | Stark | H01J 37/32082 | 204/192.37 |
| 5,009,738 A * | 4/1991 | Gruenwald | H01J 37/3244 | 156/345.47 |
| 5,210,055 A * | 5/1993 | Nakaguma | C23C 16/5096 | 118/50.1 |
| 5,232,508 A * | 8/1993 | Arena | C23C 16/44 | 118/715 |
| 5,532,190 A * | 7/1996 | Goodyear | C23C 16/45512 | 118/715 |
| 5,735,960 A * | 4/1998 | Sandhu | C23C 16/4412 | 118/715 |
| 5,772,770 A * | 6/1998 | Suda | C23C 16/4401 | 118/719 |
| 5,891,350 A * | 4/1999 | Shan | H01J 37/32477 | 118/723 E |
| 5,898,727 A * | 4/1999 | Fujikawa | C23C 14/5806 | 373/110 |
| 5,919,332 A * | 7/1999 | Koshiishi | C23C 16/5096 | 118/723 E |
| 6,074,518 A * | 6/2000 | Imafuku | H01J 37/32623 | 118/723 E |
| 6,106,663 A * | 8/2000 | Kuthi | H01J 37/32009 | 118/50.1 |
| 6,394,733 B1 * | 5/2002 | Toda | H01L 21/67017 | 406/192 |
| 6,415,736 B1 * | 7/2002 | Hao | H01L 21/67017 | 118/723 E |
| 6,475,336 B1 * | 11/2002 | Hubacek | C23C 16/4585 | 118/723 E |
| 6,539,891 B1 * | 4/2003 | Lee | C23C 16/4405 | 118/715 |
| 6,846,380 B2 * | 1/2005 | Dickinson | B08B 3/04 | 118/719 |
| 6,875,281 B2 * | 4/2005 | Kitano | G03F 7/168 | 118/665 |
| 6,921,456 B2 * | 7/2005 | Biberger | H01L 21/67051 | 118/715 |
| 6,974,523 B2 * | 12/2005 | Benzing | H01J 37/3244 | 156/345.43 |
| 7,056,831 B2 * | 6/2006 | Iwai | H01J 37/20 | 156/345.51 |
| 7,160,577 B2 * | 1/2007 | Ahn | C23C 16/4412 | 427/255.31 |
| 7,699,023 B2 * | 4/2010 | Chen | C23C 16/34 | 118/715 |
| 7,699,932 B2 * | 4/2010 | Miller | C23C 16/45544 | 118/715 |
| 7,740,705 B2 * | 6/2010 | Li | C23C 16/4412 | 118/715 |
| 7,794,546 B2 * | 9/2010 | Li | C23C 16/4409 | 118/719 |
| 7,837,825 B2 * | 11/2010 | Fischer | H01J 37/32642 | 118/723 E |
| 7,845,309 B2 * | 12/2010 | Condrashoff | H01J 37/32834 | 118/723 E |
| 7,976,898 B2 * | 7/2011 | Hong | C23C 16/045 | 427/248.1 |
| 7,993,457 B1 * | 8/2011 | Krotov | C23C 16/45544 | 118/719 |
| 8,008,596 B2 * | 8/2011 | Koshiishi | H01J 37/32532 | 118/723 I |
| 8,211,230 B2 * | 7/2012 | Verghese | C23C 16/4408 | 118/715 |
| 8,282,735 B2 * | 10/2012 | Choi | C23C 16/45504 | 118/715 |
| 8,349,085 B2 * | 1/2013 | Tahara | C23C 16/401 | 118/719 |
| 8,506,713 B2 * | 8/2013 | Takagi | C23C 16/409 | 118/715 |
| 8,545,940 B2 * | 10/2013 | Choi | C23C 16/45504 | 427/255.15 |
| 8,826,855 B2 * | 9/2014 | Kellogg | H01J 37/32091 | 118/723 E |
| 8,933,375 B2 * | 1/2015 | Dunn | H01L 21/67109 | 118/724 |
| 9,005,539 B2 * | 4/2015 | Halpin | B01J 8/0035 | 422/236 |
| 9,359,672 B2 * | 6/2016 | Verghese | C23C 16/4408 | |
| 9,567,669 B2 * | 2/2017 | Cho | C23C 16/4412 | |
| 9,644,266 B2 * | 5/2017 | Nasu | C23C 16/4408 | |
| 9,714,465 B2 * | 7/2017 | Tsuei | C23C 16/45559 | |
| 9,963,782 B2 * | 5/2018 | Tsuji | C23C 16/4412 | |
| 2001/0036682 A1 * | 11/2001 | Takeda | H01J 9/027 | 438/34 |
| 2002/0009944 A1 * | 1/2002 | Ouchi | H01J 9/261 | 445/24 |
| 2002/0122885 A1 * | 9/2002 | Ahn | C23C 16/45525 | 427/255.28 |
| 2003/0205202 A1 * | 11/2003 | Funaki | C23C 16/4404 | 118/723 E |
| 2003/0207032 A1 * | 11/2003 | Ahn | C23C 16/4412 | 427/255.34 |
| 2003/0207033 A1 * | 11/2003 | Yim | C23C 16/45565 | 427/255.37 |
| 2003/0209324 A1 * | 11/2003 | Fink | H01J 37/20 | 156/345.48 |
| 2004/0035532 A1 * | 2/2004 | Jung | H01J 37/32082 | 156/345.43 |
| 2004/0050496 A1 * | 3/2004 | Iwai | H01J 37/20 | 156/345.51 |
| 2004/0221808 A1 * | 11/2004 | Kawano | C23C 16/4401 | 118/715 |
| 2004/0231799 A1 * | 11/2004 | Lee | C23C 16/4412 | 156/345.34 |
| 2005/0011447 A1 * | 1/2005 | Fink | C23C 16/45565 | 118/715 |
| 2006/0060138 A1 * | 3/2006 | Keller | C23C 16/45565 | 118/715 |
| 2006/0137608 A1 * | 6/2006 | Choi | C23C 16/14 | 118/715 |
| 2006/0249077 A1 * | 11/2006 | Kim | C23C 16/4412 | 118/723 MP |
| 2007/0026540 A1 * | 2/2007 | Nooten | C23C 16/045 | 438/5 |
| 2007/0116872 A1 * | 5/2007 | Li | C23C 16/12 | 427/248.1 |
| 2007/0116873 A1 * | 5/2007 | Li | C23C 16/4401 | 427/248.1 |
| 2007/0157683 A1 * | 7/2007 | Li | C23C 16/4401 | 70/209 |
| 2007/0209588 A1 * | 9/2007 | Li | C23C 16/4412 | 118/715 |
| 2007/0209590 A1 * | 9/2007 | Li | C23C 16/4401 | 118/719 |
| 2007/0212484 A1 * | 9/2007 | Li | C23C 16/4412 | 427/248.1 |
| 2007/0284045 A1 * | 12/2007 | Fischer | H01J 37/32082 | 156/345.43 |
| 2008/0081114 A1 * | 4/2008 | Johanson | C23C 16/45565 | 427/273 |
| 2008/0099145 A1 * | 5/2008 | Keller | C23C 16/45565 | 156/345.34 |
| 2008/0179006 A1 * | 7/2008 | Tahara | C23C 16/401 | 156/345.29 |
| 2008/0182412 A1 * | 7/2008 | Bailey, III | H01J 37/32366 | 438/689 |
| 2009/0047426 A1 * | 2/2009 | Park | C23C 16/45508 | 427/248.1 |

(56) References Cited

U.S. PATENT DOCUMENTS

| | | | |
|---|---|---|---|
| 2009/0136665 A1* | 5/2009 | Choi | C23C 16/45504 427/255.7 |
| 2009/0156015 A1* | 6/2009 | Park | C23C 16/45519 438/758 |
| 2009/0325386 A1* | 12/2009 | Devine | C23C 16/4412 438/706 |
| 2010/0037820 A1* | 2/2010 | Lee | C23C 16/45551 118/719 |
| 2010/0041213 A1* | 2/2010 | Lee | C23C 16/45551 438/478 |
| 2010/0136216 A1* | 6/2010 | Tsuei | C23C 16/45559 427/9 |
| 2010/0215871 A1* | 8/2010 | Lee | C23C 16/06 427/569 |
| 2011/0024399 A1* | 2/2011 | Kim | H01J 37/32009 219/121.41 |
| 2012/0027953 A1* | 2/2012 | Lee | C23C 16/45536 427/569 |
| 2013/0025787 A1* | 1/2013 | Yang | H01J 37/32633 156/345.29 |
| 2015/0126044 A1* | 5/2015 | Kato | C23C 16/4584 438/790 |
| 2016/0083843 A1* | 3/2016 | Yamamoto | C23C 16/45544 118/704 |
| 2016/0160349 A1* | 6/2016 | Cho | C23C 16/4412 438/22 |
| 2016/0284517 A1* | 9/2016 | Saido | H01J 37/3244 |
| 2016/0289837 A1* | 10/2016 | Savas | H01L 21/02274 |
| 2017/0044665 A1* | 2/2017 | Shon | C23C 16/45544 |
| 2017/0076921 A1* | 3/2017 | Sakiyama | H01J 37/32935 |
| 2017/0229317 A1* | 8/2017 | Shen | H01L 21/68735 |
| 2017/0271191 A1* | 9/2017 | Yoo | C23C 16/4404 |

\* cited by examiner

SEMICONDUCTOR MANUFACTURING SYSTEM INCLUDING DEPOSITION APPARATUS

CROSS-REFERENCE TO RELATED APPLICATION

This application claims the benefit of U.S. Provisional Application No. 62/245,150, filed on Oct. 22, 2015, in the United States Patent and Trademark Office, the disclosure of which is incorporated herein in its entirety by reference.

BACKGROUND

1. Field

One or more embodiments relate to a semiconductor manufacturing system, and more particularly, to a semiconductor manufacturing system including, for example, a deposition apparatus for forming a thin layer.

2. Description of the Related Technology

To satisfy the design rules for smaller semiconductor devices, many efforts have been made to deposit thinner layers on semiconductor substrates and reduce the physical or chemical interference between thin layers by using low-temperature processes instead of high-temperature processes. If thin layers are deposited using plasma, chemical reactions between reactants may be induced without increasing the temperature of a heater on which a substrate is mounted, and the decrease of the lifespan of a reactor may be prevented unlike using at high-temperature conditions. For example, an atomic layer deposition (ALD) method is widely used to deposit thin layers in semiconductor devices having complex structures because the deposition thicknesses of the thin layers can be easily controlled in the ALD method. In addition, reaction gases not undergoing chemical reactions under thermal process may be chemically activated and be deposited to form thin layers by supplying plasma synchronized with the supply of the reaction gases in a plasma enhanced atomic layer deposition (PEALD) method, and thus the PEALD method has been widely used in industrial fields.

SUMMARY

One or more embodiments include a deposition apparatus having a reactor structure for expanding process windows and preventing plasma generated between electrodes from being extinct toward a reactor wall regardless of the relative ratio of the distance between the electrodes and the distance between an electrode and a reactor wall in a capacitively coupled plasma (CCP) reactor.

Additional aspects will be set forth in part in the description which follows and, in part, will be apparent from the description, or may be learned by practice of the presented embodiments.

According to one or more embodiments, a reactor includes: a reactor wall; an upper electrode; a lower electrode; and a gas flow control device disposed above the upper electrode and including a gas supply path.

The upper electrode and the gas flow control device may be provided separably or as one unit. In addition, a gas discharge path may be formed between the reactor wall and the gas flow control device: A gas outlet connected to an external discharge pump may be formed in an upper portion of the reactor wall making contact with the gas flow control device, so as to discharge gas through an upper portion of the reactor.

The upper electrode may be connected to an external radiofrequency (RF) power generator, and RF power may be supplied to a reaction space. A gas supply device (such as a showerhead) may be used as the upper electrode. The lower electrode may face the upper electrode, and a substrate mounting device (such as a substrate accommodating device) may be used as the lower electrode.

A portion of a lower surface of the upper surface may have a concave shape so as to induce uniform distribution of plasma in the reaction space. For example, a protrusion may be formed along the circumference of the lower surface of the upper electrode at a certain distance from the center of the lower surface of the upper electrode, and a concave portion may be formed near the protrusion. For example, a protrusion may be formed adjacent to an edge of the lower surface of the upper electrode, and a concave region may be formed inside the protrusion.

According to one or more embodiments, a semiconductor manufacturing system includes: a gas supply device functioning as a first electrode and including a plurality of injection holes; a reactor wall connected to the gas supply device; and a substrate accommodating device functioning as a second electrode, the substrate accommodating device and the reactor wall being configured to be sealed via face sealing, wherein a reaction gas supplied from the gas supply device toward the substrate accommodating device is discharged to the outside through a gas discharge path between the gas supply device and the reactor wall, and the first electrode includes a protruded electrode adjacent to an edge of the gas supply device.

A first distance between the substrate accommodating device and a center region of the gas supply device may be greater than a second distance between the reactor wall and the edge of the gas supply device, and a third distance between the substrate accommodating device and the protruded electrode of the gas supply device may be less than the second distance.

Plasma generated between the first and second electrodes may move toward the reactor wall due to radiality of the plasma in the first distance and may move toward the substrate accommodating device due to linearity of the plasma in the third distance.

The radiality of the plasma may increase as one or both of power of the plasma and a flow rate of the reaction gas increase.

The protruded electrode may have a predetermined radius of curvature. The substrate accommodating device may include a groove at a position corresponding to a position where the protruded electrode may be located. The protruded electrode and the groove may have same radius of curvature.

The gas supply device may be recessed from the protruded electrode so that a concave space may be defined in the gas supply device. The semiconductor manufacturing system may further include a gas outlet above the gas supply device. In this case, the reaction gas may be discharged to the outside through the gas discharge path and the gas outlet.

The semiconductor manufacturing system may further include a gas flow control device disposed between the gas supply device and the gas outlet. In this case, the reaction gas may be discharged to the outside through the gas discharge path, the gas flow control device, and the gas outlet.

The gas flow control device may include a plate and a sidewall protruding from the plate, and the sidewall may include a plurality of penetration holes formed therethrough.

The substrate accommodating device may include: a recess region for accommodating a substrate; and a contact region surrounding the recess region for the face sealing. The recess region may extend to a position corresponding to a position where the protruded electrode may be located.

According to one or more embodiments, a semiconductor manufacturing system includes: a reactor wall; a gas flow control device connected to the reactor wall; a gas supply device connected to the gas flow control device; and a lower electrode facing the gas supply device and contacting a lower surface of the reactor wall so that a reaction space is defined therebetween, wherein: the gas flow control device is stacked on the gas supply device; a gas inlet is formed through an upper portion of the reactor wall, the gas flow control device and the gas supply device, and a gas is supplied to the gas supply device through the gas inlet; a first distance between the lower electrode and a center region of the gas supply device is greater than a second distance between the reactor wall and an edge of the gas supply device; and a third distance between the edge of the gas supply device and an edge of the lower electrode is less than the second distance.

According to one or more embodiments, a semiconductor manufacturing system includes: a first electrode including a plurality of injection holes; a gas flow control device above the first electrode; a reactor wall connected to the first electrode and the gas flow control device; and a second electrode configured to contact the reactor wall for face sealing, wherein a reaction gas supplied toward the second electrode through the injection holes is discharged to the outside through a gas discharge path between the gas supply device and the reactor wall and through the gas flow control device, and a surface of the first electrode facing the second electrode is concave.

The semiconductor manufacturing system may further include a gas outlet disposed above the gas flow control device, wherein the reaction gas may be discharged to the outside through the gas discharge path, the gas flow control device, and the gas outlet.

The gas flow control device may include a plate and a sidewall protruding from the plate, and the sidewall may include a plurality of penetration holes.

A first distance between the second electrode and a center region of the first electrode may be greater than a second distance between the reactor wall and an edge of the first electrode, and a third distance between the edge of the first electrode and an edge of the second electrode may be less than the second distance.

The first electrode may include a protruded electrode adjacent to an edge thereof. The second electrode may include a recess region to accommodate a substrate, and the recess region may extend to a position corresponding to a position where the protruded electrode may be located.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Embodiments will now be described with reference to the accompanying drawings.

The inventive concept may, however, be embodied in many different forms and should not be construed as being limited to the embodiments set forth herein; rather, these embodiments are provided to give a clear understanding of the inventive concept to those of ordinary skill in the art. That is, the embodiments are provided so that this disclosure will be thorough and complete, and will fully convey the inventive concept to those of ordinary skill in the art In the following description, terms are used only for explaining specific embodiments while not limiting the inventive concept. The terms of a singular form may include plural forms unless referred to the contrary. The meaning of "comprise" and/or "comprising" specifies a shape, a fixed number, a step, a process, a member, an element, and/or a combination thereof but does not exclude other shapes, fixed numbers, steps, processes, members, elements, and/or combinations thereof. As used herein, the term "and/or" includes any and all combinations of one or more of the associated listed items.

It will be understood that, although the terms first, second, etc. may be used herein to describe various members, regions, and/or elements, these members, regions, and/or elements should not be limited by these terms. These terms are not used to denote a particular order, a positional relationship, or ratings of members, regions, or elements, but are only used to distinguish one member, region, or element from another member, region, or element. Thus, a first member, region, or element discussed below could be termed a second member, region, or element without departing from the teachings of the inventive concept.

Hereinafter, embodiments will be described with reference to the accompanying drawing. Shapes illustrated in the drawings may be varied according to various factors such as manufacturing methods and/or tolerances. That is, the embodiments are not limited to particular shapes illustrated in the drawings. Factors such as shape changes in manufacturing processes should be considered.

Figure 1:
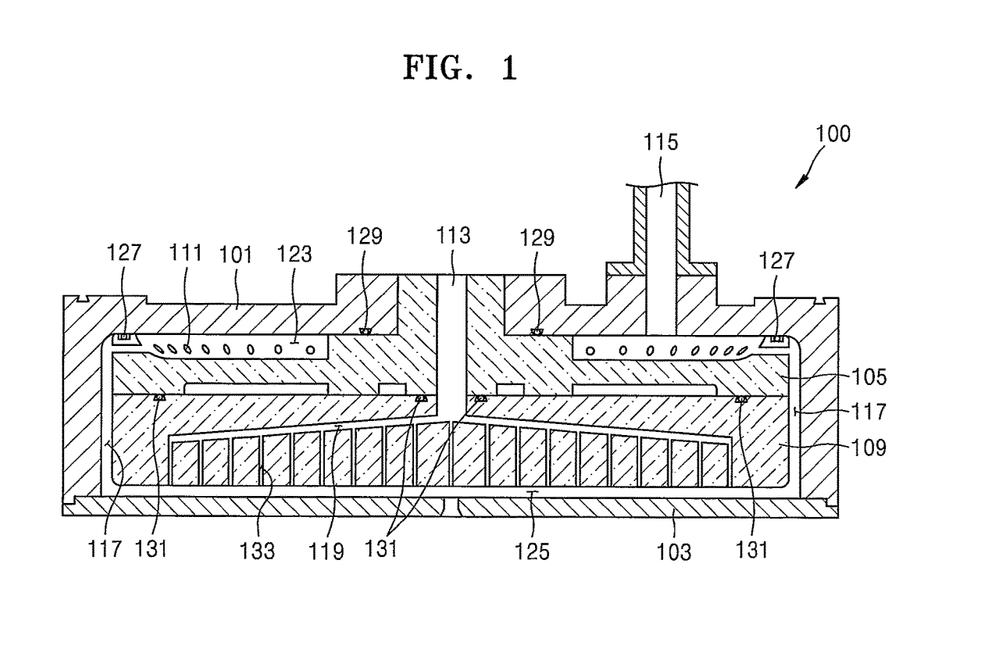
FIG. 1 is a cross-sectional view illustrating a semiconductor manufacturing system according to an embodiment.

First, a deposition apparatus will now be described according to an embodiment with respect to FIG. 1. FIG. 1 is a cross-sectional view illustrating a semiconductor manufacturing system 100 according to an embodiment. In the semiconductor manufacturing system 100 shown in FIG. 1, a reactor wall 101 may be in contact with a substrate accommodating device 103. For example, a lower surface of the reactor wall 101 may be in contact with the substrate accommodating device 103 functioning as a lower electrode, and thus a reaction space 125 may be formed between the reactor wall 101 and the substrate accommodating device 103.

In other words, the substrate accommodating device 103 and the reactor wall 101 may be in contact with each other and may be sealed via face sealing, and owing to this face sealing, the reaction space 125 may be formed between the substrate accommodating device 103 and the reactor wall 101. After the face sealing, a gas discharge path 117 may be defined among the reactor wall 101, a gas flow control device 105, and a gas supply device 109. The reactor wall 101 may be connected to the gas supply device 109 via the gas flow control device 105.

The gas flow control device 105 and the gas supply device 109 may be arranged between the reactor wall 101 and the substrate accommodating device 103. The gas flow control device 105 and the gas supply device 109 having gas injection holes 133 may be provided as one unit or a separation-type unit with a portion with gas injection holes 133 separated. In the latter case, the gas flow control device 105 may be placed on the gas supply device 109. In addition, the gas supply device 109 may be provided as a separation-type device as well. In this case, the gas supply device 109 may include: a gas injection device having a plurality of gas injection holes 133; and a gas channel located above the gas injection device (refer to FIG. 3).

The gas flow control device 105 may include a plate 301 and a sidewall 123 protruding from the plate 301. A plurality of penetration holes 111 may be formed through the sidewall 123.

Grooves 127, 129, and 131 may be formed between the reactor wall 101 and the gas flow control device 105 and between the gas flow control device 105 and the gas supply device 109 to accommodate sealing members such as O-rings. Owing to the sealing members, external gas may not permeate into the reaction space 125. In addition, owing to the sealing members, a reaction gas may be discharged from the reaction space 125 along predetermined paths (that is, the gas discharge path 117 and a gas outlet 115 shown in FIG. 2). That is, the reaction gas may not leak through other regions from the predetermined paths.

The gas supply device 109 may be used as an electrode in a plasma process such as a capacitively coupled plasma (CCP) process. In this case, the gas supply device 109 may include a metal such as aluminum (Al). In a CCP process, the substrate accommodating device 103 may also be used as an electrode. That is, capacitive coupling may be achieved by the gas supply device 109 functioning as a first electrode and the substrate accommodating device 103 functioning as a second electrode.

Figure 3:
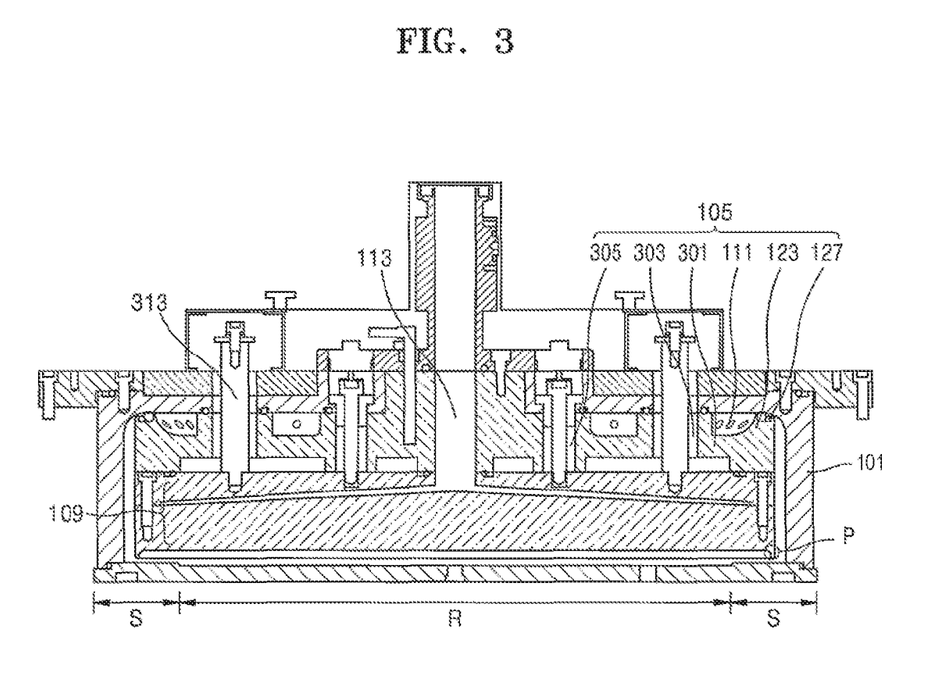
FIG. 3 is another cross-sectional view illustrating the semiconductor manufacturing system of the embodiment.

For example, plasma generated by an external plasma generator (not shown) may be supplied to the gas supply device 109 through radiofrequency (RF) rods 313 (refer to FIG. 3). The RF rods 313 may be mechanically connected to the gas supply device 109 through RF rod holes 303 formed through an upper portion of the reactor wall 101 and the gas flow control device 105.

Optionally, the gas supply device 109 may include a conductive material, and the gas flow control device 105 may include an insulative material such as a ceramic material so as to insulate the gas supply device 109 used as a plasma electrode from the reactor wall 101.

A protruded electrode P may be arranged adjacent to an edge of the gas supply device 109. The protruded electrode P may prevent extinction of plasma toward the reactor wall 101. The protruded electrode P will be further described later.

As shown in FIG. 1, a gas inlet 113 is formed through the upper portion of the reactor wall 101 and a center portion of the gas flow control device 105. In addition, a gas flow path 119 is additionally formed in the gas supply device 109 such that a reaction gas supplied from an external gas supply unit (not shown) through the gas inlet 113 may be uniformly distributed to the gas injection holes 133 of the gas supply device 109 through the gas flow path 119.

In addition, as shown in FIG. 1, the gas outlet 115 is formed in the upper portion of the reactor wall 101 in an asymmetric relationship with the gas inlet 113. However, the gas outlet 115 and the gas inlet 113 may be symmetric with each other (not shown). In addition, since the reactor wall 101 is spaced apart from a sidewall of the gas flow control device 105 (and a sidewall of the gas supply device 109) to form the gas discharge path 117, a reaction gas remaining after a process may be discharged through the gas discharge path 117.

Figure 2:
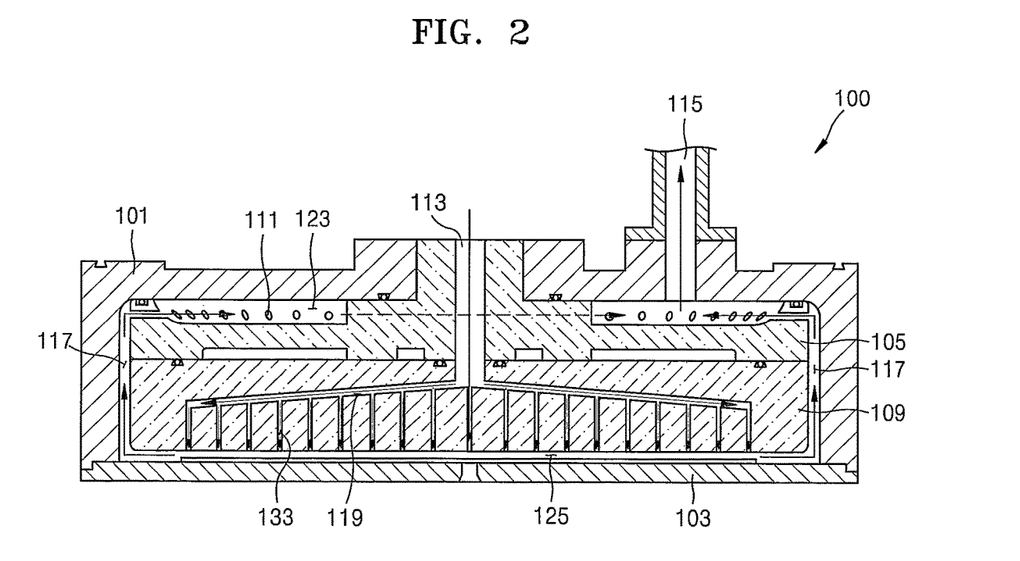
FIG. 2 is a view illustrating flows of a reaction gas (and remaining gas) in the semiconductor manufacturing system of the embodiment.

FIG. 2 is a view illustrating flows of a reaction gas (and remaining gas) in the semiconductor manufacturing system 100. In FIG. 2, arrows indicate gas flows. A reaction gas supplied from the external gas supply unit (not shown) to the gas inlet 113 may uniformly flow to the gas injection holes 133 of the gas supply device 109 (such as a showerhead) through the gas flow path 119.

The reaction gas may undergo a chemical reaction in the reaction space 125 or on a substrate on the substrate accommodating device 103 to form a thin layer on the substrate. After the thin layer is formed, remaining gas may flow into the gas flow control device 105 through the gas discharge path 117 formed between the reactor wall 101 and the sidewall of the gas supply device 109 and the penetration holes 111 formed in the sidewall 123 of the gas flow control device 105, and may then be discharged through the gas outlet 115.

FIG. 3 is another cross-sectional view illustrating the semiconductor manufacturing system 100 of the embodiment. Referring to FIG. 3, the gas flow control device 105 includes the sidewall 123, the gas inlet 113, the plate 301 surrounded by the sidewall 123, the RF rod holes 303, screw holes 305, the penetration holes 111, and the groove 127 accommodating a sealing member such as an O-ring.

The plate 301 may have a concave inner portion surrounded by the sidewall 123. The gas inlet 113 is located in a region of the gas flow control device 105 as a path for receiving a reaction gas. The screw holes 305 are at least two in number and are formed around the gas inlet 113, and mechanical connection members such as screws may be inserted through the screw holes 305 to connect the gas flow control device 105 and the gas supply device 109. The RF rod holes 303 are formed in another region of the gas flow control device 105, and thus the RF rods 313 connected to an external plasma supply unit (not shown) may be connected to the gas supply device 109 disposed under the gas flow control device 105 through the RF rod holes 303.

The gas supply device 109 connected to the RF rods 313 may be used as an electrode in a plasma process such as a CCP process. The protruded electrode P may be arranged along the edge of the gas supply device 109.

Owing to the protruded electrode P, a lower surface of the gas supply device 109 (that is, a surface facing the substrate accommodating device 103) may be curved to form a concave space.

The structure of a reaction space may have a significant effect on a plasma process. For example, when a plasma process is performed by a CCP method using plasma generated by RF power applied between upper and lower electrodes, if the upper electrode functioning as an RF power electrode (for example, the gas supply device 109 such as a showerhead) is flat, the density of the plasma may be higher in a center region of a reaction space (for example, the reaction space 125 shown in FIG. 1) than in a peripheral region of the reaction space. This may not cause a significant problem when the distance between the upper and lower electrodes is small. However, when the distance between the upper and lower electrodes is large, the plasma may be extinct from the peripheral region of the reaction space toward a reactor wall due to the radiality of the plasma. In this case, the properties of a layer (such as thickness uniformity or a wet etch rate (WER) in a later etch process) formed on a substrate may markedly vary between center and edge regions of the substrate. That is, it may be difficult to form a uniform layer.

For example, the ratio of the distance between the upper and lower electrodes to the distance between the upper electrode and the reactor wall (that is, the width of the gas discharge path 117) is a factor to be considered. That is, if the distance between the upper and lower electrodes is greater than the distance between the upper electrode and the reactor wall, a portion of plasma, for example, plasma generated in an edge region of the upper electrode through which RF power is supplied, may move toward the reactor wall instead of moving toward the lower electrode. As a result, plasma power coupling reliability may decrease, and the properties of a thin layer such as uniformity may deteriorate in an edge region of a substrate. This phenomenon may obviously occur as one or both of the flow rate of a reaction gas and the power of plasma increase (refer to FIGS. 13 and 14). Therefore, CCP reactors of the related art have restricted process windows due to the above-described phenomenon.

However, the semiconductor manufacturing system 100 of the current embodiment includes the protruded electrode P along the edge of the gas supply device 109. Therefore, plasma power coupling reliability may be improved in the reaction space 125, and the thickness of a thin layer may not be locally decreased (i.e. improved uniformity). Furthermore, a process window for a stable deposition process may be expanded, and thus the deposition process may be flexibly performed.

The protruded electrode P may have a predetermined radius of curvature. According to an additional embodiment, the radius of curvature of the protruded electrode P may be varied according to process conditions. For example, the radius of curvature of the protruded electrode P may be about R3.0 (3.0 mm).

The substrate accommodating device 103 may include a recess region R for accommodating a substrate and a contact region S surrounding the recess region R. A substrate may be placed in the recess region R, and the reactor wall 101 may hermetically be in contact with the contact region S (face sealing). The recess region R may extend to a position corresponding to a position at which the protruded electrode P is located. This will be further described later.

Figure 4:
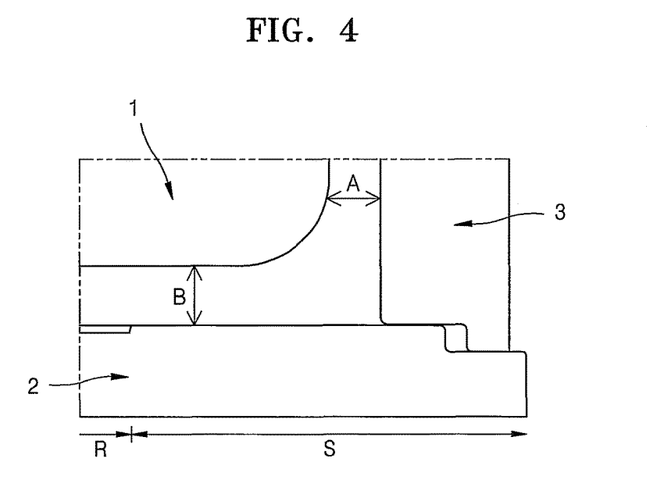
FIGS. 4 and 5 are a view illustrating a semiconductor manufacturing system of the related art and a view illustrating a semiconductor manufacturing system according to an embodiment.
Figure 5:
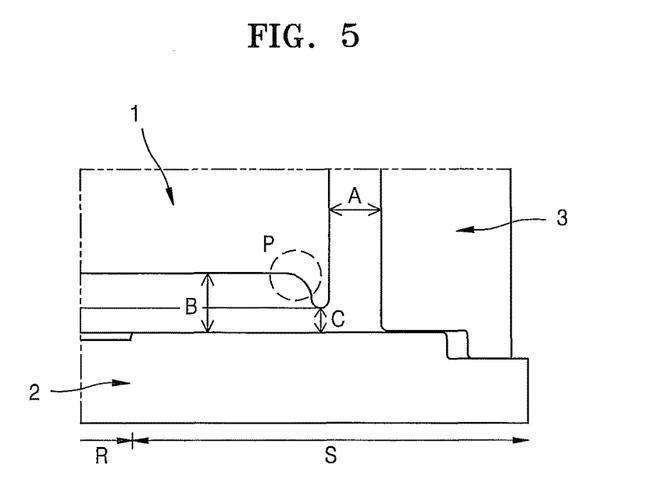

FIGS. 4 and 5 are a view illustrating a semiconductor manufacturing system of the related art and a view illustrating a semiconductor manufacturing system according to an embodiment.

Referring to FIG. 4, in the semiconductor manufacturing system of the related art, a reaction space is defined by an inter-electrode distance B between an upper electrode and a lower electrode 2. If RF power is applied to the upper electrode 1, plasma may be generated in the reaction space. In this case, however, if a gas supply device such as a showerhead including gas injection holes is used as the upper electrode 1, the shapes of the gas injection holes of the showerhead may be unintendedly transferred to a substrate. Thus, the inter-electrode distance B may be increased to prevent this. In this case, however, if the inter-electrode distance B is greater than a distance A between the upper electrode 1 and a reactor wall 3, plasma generated in an edge region of the reaction space may move toward the reactor wall 3 instead of moving toward the lower electrode 2. As a result, plasma power coupling reliability may decrease, and the uniformity of a thin layer formed on a substrate may be lower in an edge region of the substrate than in a center region of the substrate.

Referring to FIG. 5, in the semiconductor manufacturing system of the embodiment, an inter-electrode distance B (or first distance) between an upper electrode 1 and a lower electrode 2 is greater than a distance A (or second distance) between the upper electrode 1 and a reactor wall 3 as in the semiconductor manufacturing system shown in FIG. 4, and a protruded electrode P is formed adjacent to an edge of the upper electrode 1. As a result, a distance C (or third distance) between the edge of the upper electrode 1 and the lower electrode 2 is less than the distance A between the upper electrode 1 and the reactor wall 3. that is, B>A>C may be satisfied.

Owing to the protruded electrode P, even if the inter-electrode distance B is greater than the distance A between the upper electrode 1 and the reactor wall 3, the uniformity of plasma may be maintained in a reaction space without the loss of plasma power to the reactor wall 3. For example, since plasma generated by the upper and lower electrodes 1 and 2 has strong radiality in the inter-electrode distance B, the plasma may be extinct toward the reactor wall 3 along the distance A shorter than the inter-electrode distance B. However, this extinction of plasma toward the reactor wall 3 is prevented by the protruded electrode P. In addition, since plasma generated by the protruded electrode P and the lower electrode 2 has strong linearity in the distance C, the plasma may not move toward the reactor wall 3 along the distance A greater than the distance C but may move toward a substrate accommodating device functioning as the lower electrode 2.

Figure 6:
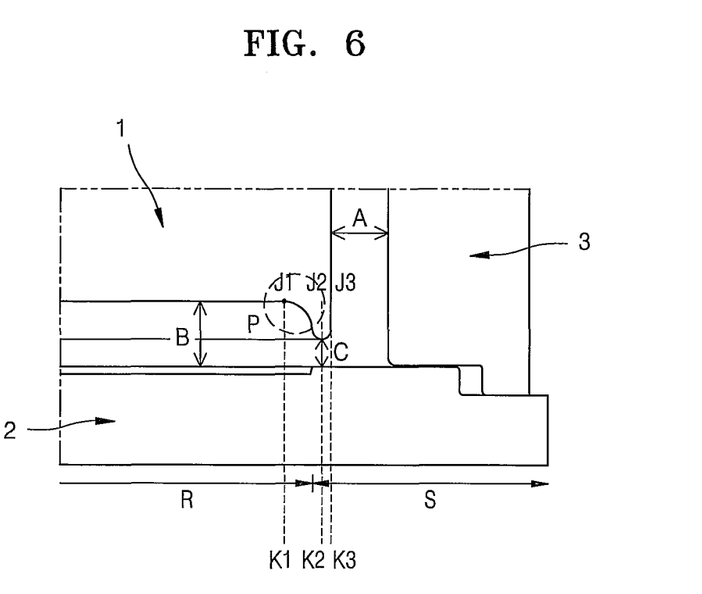
FIG. 6 is a cross-sectional view illustrating a semiconductor manufacturing system according to another embodiment.

FIG. 6 is a cross-sectional view illustrating a semiconductor manufacturing system according to another embodiment.

Referring to FIG. 6, a substrate accommodating device functioning as a lower electrode 2 may include a recess region R extending to a position corresponding to a position at which a protruded electrode P is located. Herein, the expression "the recess region R extends to a position corresponding to a position at which the protruded electrode P is located" means that the recess region R extends to one of imaginary lines K1, K2, and K3 (or an arbitrary line between the imaginary lines K1, K2, and K3) that are drawn in a direction perpendicular to the lower electrode 2 from one of a start position J1 from which the protruded electrode P starts to protrude, a center position J2 of the protruded electrode P, and an end position J3 of the protruded electrode P.

According to the current embodiment, although the recess region R of the substrate accommodating device functioning as the lower electrode 2 extends to a position corresponding to an edge of an upper electrode 1 (that is, a gas supply device), a deposition process may be performed without extinction of plasma to a reactor wall. Therefore, space efficiency for depositing thin layers on large substrates may be achieved while maintaining the quality of thin layers.

Figure 7A:
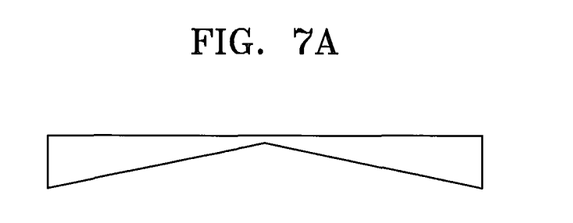
FIGS. 7A and 7B are cross-sectional views illustrating modifications of an upper electrode of a semiconductor manufacturing system according to embodiments.
Figure 7B:
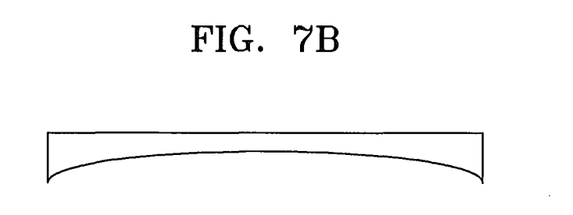

FIGS. 7A and 7B are cross-sectional views illustrating modifications of an upper electrode of a semiconductor manufacturing system according to embodiments.

Referring to FIGS. 7A and 7B, an electrode surface of a gas supply devices may be variously shaped. For example, the gas supply device may include an electrode surface (that is, a surface facing a substrate accommodating device) having a cone shape as shown in FIG. 7A or a concave shape (such as a dome shape) as shown in FIG. 7B. In addition, the gas supply device may include a protruded electrode having a stepped shape (not shown). That is, the scope of the inventive concept may extend to any electrode shapes as long as the distance between a center region of an upper electrode and a lower electrode is greater than the distance between the lower electrode and an edge of the upper electrode.

Referring to FIGS. 7A and 7B, the gas supply device includes an electrode having a flat upper surface. However, the upper surface of the electrode of the gas supply device may be variously shaped. For example, the upper surface of the electrode of the gas supply device may have a cone shape or a convex shape.

Figure 8:
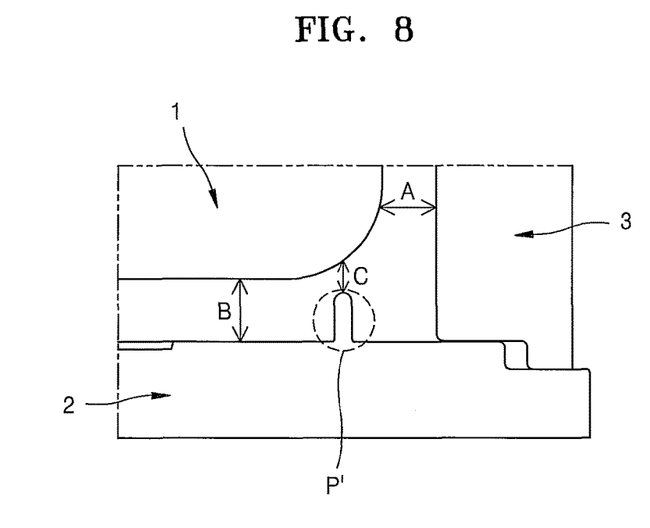
FIGS. 8 and 9 are cross-sectional views illustrating semiconductor manufacturing systems according to another embodiments.
Figure 9:
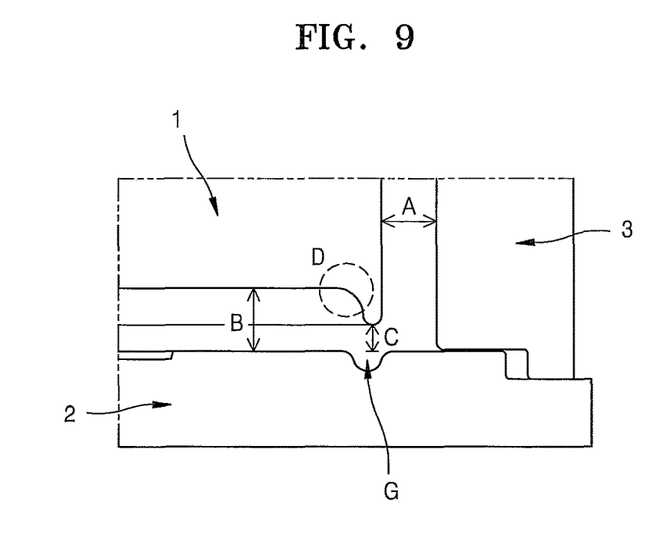

FIGS. 8 and 9 are cross-sectional views illustrating semiconductor manufacturing systems according to other embodiments.

Referring to FIG. 8, a protruded electrode P' may be arranged along and/or adjacent to an edge of a lower electrode 2. For example, the protruded electrode P' may be arranged in a contact region S of a substrate accommodating device functioning as the lower electrode 2.

In the previous embodiments, the protruded electrodes P are disposed on the gas supply devices functioning as the upper electrode. In the current embodiment, however, the protruded electrode P' is disposed on the lower electrode 2 such that the distance between center regions of an upper electrode 1 and the lower electrode 2 may be greater than the distance between edges of the upper and lower electrodes 1 and 2. Although not shown in FIG. 8, protruded electrodes P' may be respectively disposed on the upper and lower electrodes 1 and 2.

Referring to FIG. 9, a substrate accommodating device functioning as a lower electrode 2 may include a groove G at a position corresponding to a position at which a protruded electrode P is located. Owing to the groove G, plasma and remaining gas may be less affected by a bottleneck phenomenon in a peripheral region of a reaction space. According to an additional embodiment, the protruded electrode P and the groove G may have the same radius of curvature.

Figure 10:
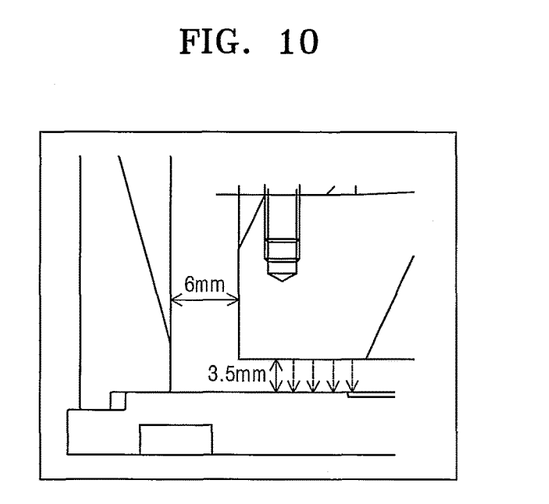
FIGS. 10 to 12 are views illustrating plasma coupling reliability.
Figure 11:
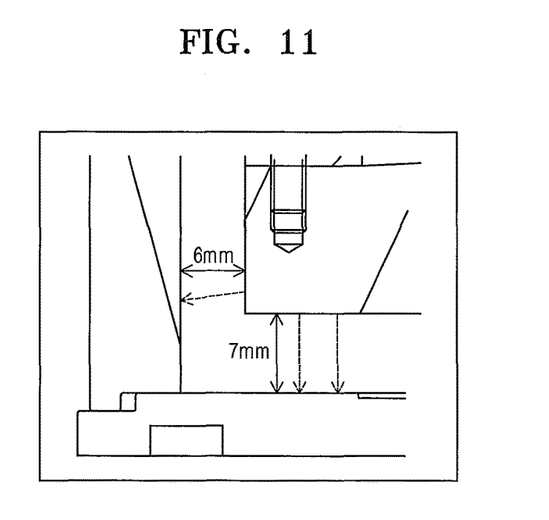
Figure 12:
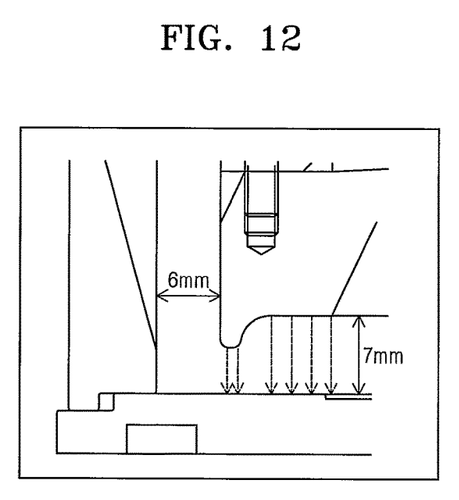

FIGS. 10 to 12 are views illustrating plasma coupling reliability. FIGS. 10 and 11 are views illustrating the plasma coupling reliability of a reactor of the related art, and FIG. 12 is a view illustrating the plasma coupling reliability of a reactor according to an embodiment.

Referring to FIG. 10, an inter-electrode distance is 3.5 mm, and the inter-electrode distance is less than a distance of 6 mm between an upper electrode and a reactor wall. In this case, RF power (indicated by dashed lines) may be transmitted from the upper electrode to a lower electrode without loss, and thus plasma power coupling reliability may not be decreased in a reaction space. Therefore, a thin layer deposited on a substrate may be uniform over center and edge regions of the substrate.

Referring to FIG. 11, the inter-electrode distance is 7 mm, and the inter-electrode distance is greater than the distance of 6 mm between the upper electrode and the reactor wall. In this case, RF power may partially be extinct from an edge region of the upper electrode toward the reactor wall instead of being transmitted intact to the lower electrode. That is, plasma may partially leak toward the reactor wall instead of moving toward the lower electrode.

Referring to FIG. 12, an inter-electrode distance and the distance between an upper electrode and a reactor wall are respectively 7 mm and 6 mm as in FIG. 11. However, referring to FIG. 12, a protruded electrode is arranged adjacent to an edge of the upper electrode. Therefore, unlike the structure shown in FIG. 11, extinction of plasma toward a reactor wall may be prevented. Even though the height of a reaction space increases, plasma power coupling reliability and the uniformity of thin layer deposited may not decrease in the reaction space owing to the protruded electrode.

Figure 13:
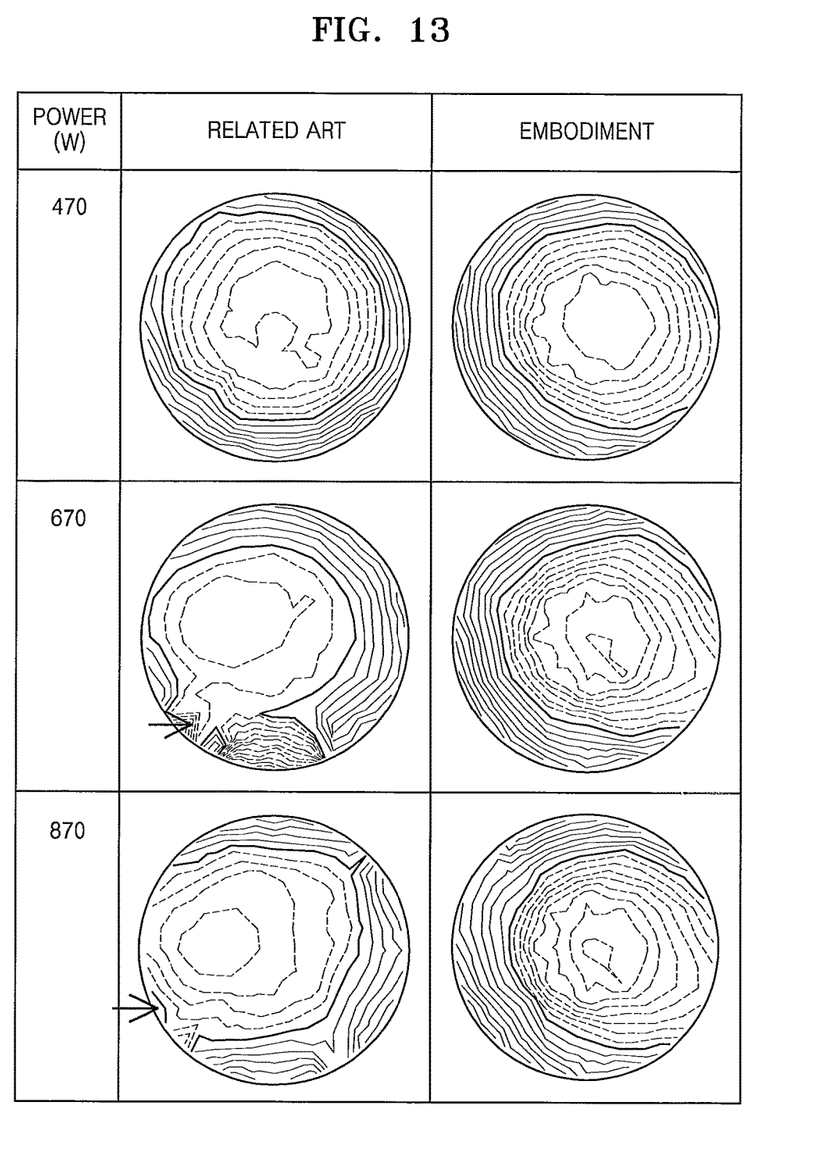
FIGS. 13 and 14 are views illustrating thin layer uniformity according to plasma power (a) and oxygen flow rate (b) when $SiO_2$ layers are formed by a plasma enhanced atomic layer deposition (PEALD) method using a reactor of the existing art and a reactor according to an embodiment.
Figure 14:
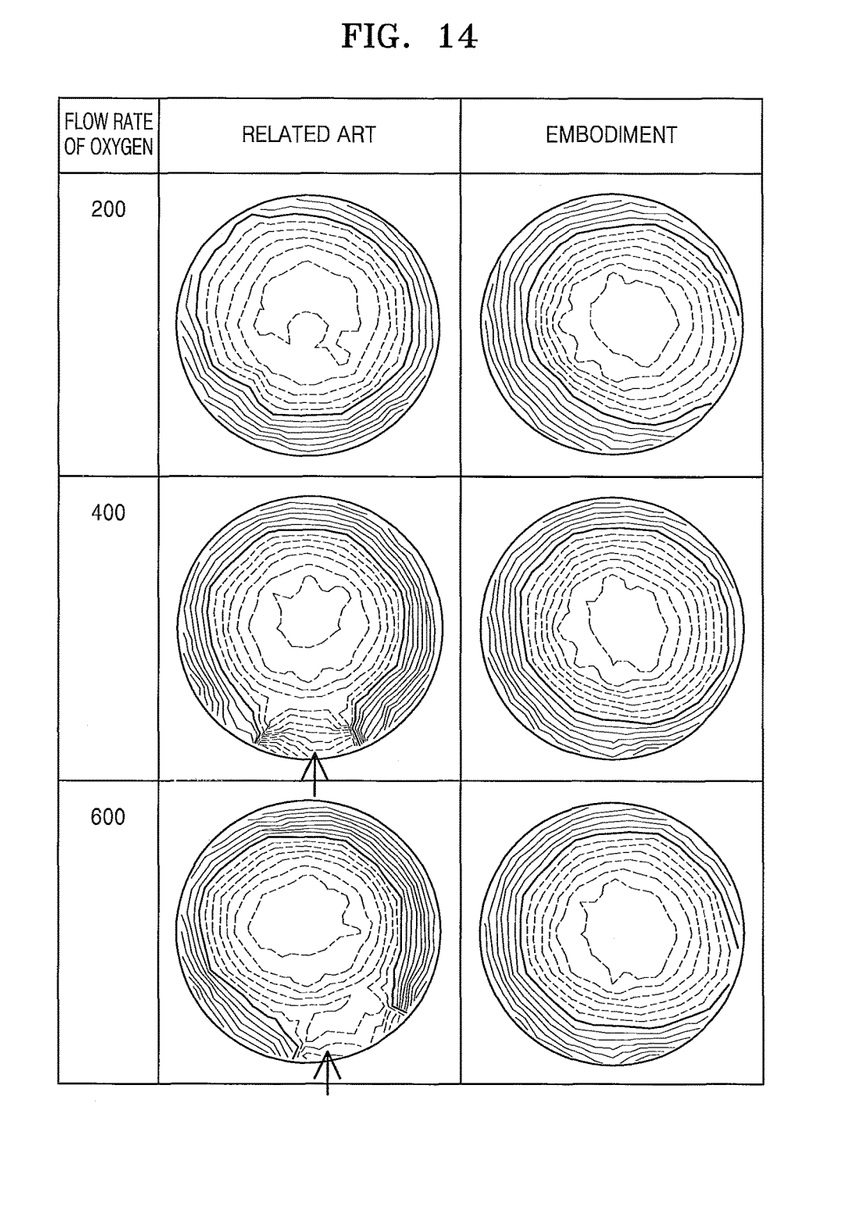

FIGS. 13 and 14 are views illustrating thin layer uniformity according to plasma power (a) and oxygen flow rate (b) when silicon oxide layers are formed by a plasma enhanced atomic layer deposition (PEALD) method using a reactor of the related art and a semiconductor manufacturing system according to an embodiment.

Referring to FIG. 13, along with the increase of RF power supplied to an upper electrode of the reactor of the related art, the thickness of thin layers decreased in edge regions of substrates, and the uniformity of the thin layers decreased. In FIG. 13, regions in which the thickness of the thin layers decreased are indicated with arrows. However, even though RF power was increased in a reactor according to the embodiment, the thickness of thin layers did not decrease in edge regions of substrates.

FIG. 14 illustrates the uniformity of thin layers according to the flow rate of oxygen supplied to reaction spaces when RF power was maintained constant. In FIG. 14, regions in which the thickness of thin layers decreased are indicated with arrows. Referring to FIG. 14, as the flow rate of oxygen was increased, the thickness of thin layers decreased in edge regions of substrates when the reactor of the related art was used. However, the thickness of thin layers did not decrease regardless of the flow rate of oxygen when the reactor according to the embodiment was used.

Figure 15:
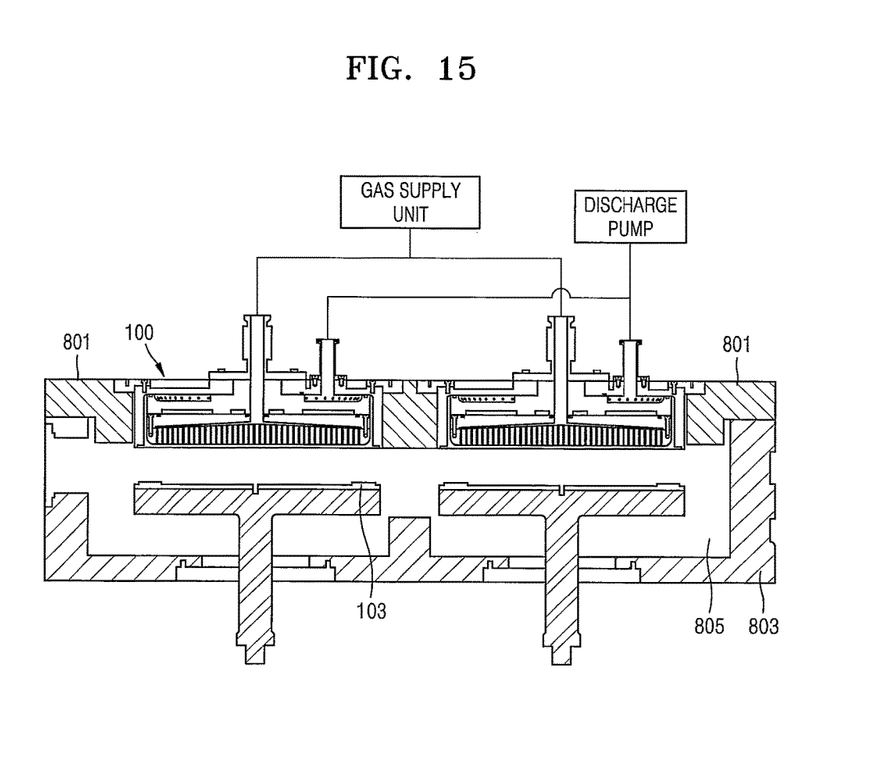
FIG. 15 is a cross-sectional view illustrating a semiconductor manufacturing system according to another embodiment.

FIG. 15 is a cross-sectional view illustrating a semiconductor manufacturing system according to another embodiment. Referring to FIG. 15, a plurality of reaction chambers 100 are disposed in a chamber inner region 805 formed by a top lid 801 and an external chamber 803. A gas flow control device, a showerhead, a gas inlet, and a gas outlet of each of the reaction chambers 100 are disposed in the top lid 801. The reaction chambers 100 share the same gas supply unit and the same discharge pump, and thus the same process may be performed on a plurality of substrate at the same time so as to increase productivity.

The same process may be performed on a plurality of substrates at the same time as follows. First, a substrate transfer device is inserted into the chamber inner region 805 through a door located at a lateral side of the external chamber 803 so as to place substrates on a plurality of susceptors 103. Thereafter, the chamber inner region 805 of the external chamber 803 is evacuated or filled with an inert gas such as argon gas. Next, the susceptors 103 are lifted and brought into contact with lower sides of reactor walls 101, thereby forming reaction spaces. The pressure of the chamber inner region 805 may be set to be lower than the internal pressure of the reaction chambers 100.

Alternatively, the reaction chambers 100 may not share the gas supply unit and the discharge pump but may be connected to individual gas supply units and discharge pumps so as to perform different processes at the same time. For example, while sequentially moving a substrate to the reaction chambers 100, a composite thin layer forming process may be performed to deposit thin layers on the substrate. In this case, the composite thin layer forming process may be rapidly performed while minimizing exposure to air or waiting time.

The shapes of parts illustrated in the accompanying drawings are examples provided for clear understanding of the embodiments. That is, the shapes of parts may be varied.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A semiconductor manufacturing system comprising:
   a gas supply device functioning as a first electrode and comprising a plurality of injection holes;
   a reactor wall surrounding the gas supply device; and
   a substrate accommodating device functioning as a second electrode, the substrate accommodating device and the reactor wall being configured to be sealed via face sealing,
   wherein a reaction gas supplied from the gas supply device toward the substrate accommodating device is discharged to the outside through a gas discharge path between the gas supply device and the reactor wall, and the first electrode comprises a protruded electrode disposed at an edge of the first electrode adjacent to the reactor wall,
   wherein the gas supply device includes a gas injection device having the plurality of injection holes and a has channel above the gas injection device,
   wherein the protruded electrode protrudes from a lower portion of the gas injection device that is below the plurality of injection holes, and
   wherein the protruded electrode is an integral part of the first electrode and continuously extends from the edge of the first electrode so as to directly face the second electrode.

2. The semiconductor manufacturing system of claim 1, wherein a first distance between the substrate accommodating device and a center region of the gas supply device is greater than a second distance between the reactor wall and the edge of the gas supply device, and
   a third distance between the substrate accommodating device and the protruded electrode of the gas supply device is less than the second distance.

3. The semiconductor manufacturing system of claim 2, wherein the protruded electrode and the second electrode are configured to generate plasma therebetween and move the generated plasma toward the substrate accommodating device.

4. The semiconductor manufacturing system of claim 3, wherein the protruded electrode and the second electrode are further configured to at least partially prevent the generated plasma from moving toward the reactor wall.

5. The semiconductor manufacturing system of claim 1, wherein the protruded electrode has a predetermined radius of curvature.

6. The semiconductor manufacturing system of claim 1, wherein the gas supply device is recessed from the protruded electrode so that a concave space is defined in the gas supply device.

7. The semiconductor manufacturing system of claim 1, further comprising a gas outlet above the gas supply device,
   wherein the reaction gas is discharged to the outside through the gas discharge path and the gas outlet.

8. The semiconductor manufacturing system of claim 7, further comprising a gas flow control device disposed between the gas supply device and the gas outlet,
   wherein the reaction gas is discharged to the outside through the gas discharge path, the gas flow control device, and the gas outlet.

9. The semiconductor manufacturing system of claim 8, wherein the gas flow control device comprises a plat and a sidewall protruding from the plate, and
   the sidewall comprises a plurality of penetration holes formed therethrough.

10. The semiconductor manufacturing system of claim 1, wherein the substrate accommodating device comprises a groove at a position corresponding to a position where the protruded electrode is located.

11. The semiconductor manufacturing system of claim 10, wherein the protruded electrode and the groove have same radius of curvature.

12. The semiconductor manufacturing system of claim 1, wherein the substrate accommodating device comprises:
    a recess region for accommodating a substrate; and
    a contact region surrounding the recess region for the face sealing.

13. The semiconductor manufacturing system of claim 12, wherein the recess region extends to a position corresponding to a position where the protruded electrode is located.

14. A semiconductor manufacturing system comprising:
    a reactor wall;
    a gas flow control device surrounded by the reactor wall;
    a gas supply device functioning as an upper electrode and connected to the gas flow control device; and
    a lower electrode facing the gas supply device and contacting a lower surface of the reactor wall so that a reaction space is defined therebetween,
    wherein the gas flow control device is disposed on the gas supply device,
    wherein the gas supply device includes a gas injection device having a plurality of injection holes and a gas channel above the gas injection device,
    wherein a gas inlet is formed through an upper portion of the reactor wall, the gas flow control device, and the gas supply device, and a gas is suppled to the gas supply device through the gas inlet,
    wherein a first distance between the lower electrode and a center region of the gas injection device is greater than a second distance between the reactor wall and an edge of the gas injection device, and wherein a third distance between the edge of the gas injection device and an edge of the lower electrode is less than the second distance, wherein the gas injection device further comprises a protruded electrode disposed at an edge of the upper electrode adjacent to the reactor wall, wherein the protruded electrode protrudes from a lower portion of the gas injection device that is below the plurality of injection holes, and wherein the protruded electrode is an integral part of the upper electrode and continuously extends from the edge of the upper electrode so as to directly face the lower electrode.

15. A semiconductor manufacturing system comprising:

a gas supply device functioning as a first electrode, the gas supply device including a gas injection device comprising a plurality of injection holes and a gas channel above the gas injection device;

a gas flow control device above the first electrode;

a reactor wall surrounding the first electrode and the gas flow control device; and a second electrode configured to be sealed together with the reactor wall via face sealing, wherein a reaction gas supplied toward the second electrode through the injection holes is discharged to the outside through a gas discharge path between the gas supply device and the reactor wall and through the gas flow control device, wherein the gas injection device further comprises a protruded electrode disposed at an edge of the first electrode adjacent to the reactor wall, wherein the protruded electrode protrudes from a lower portion of the gas injection device that is below the plurality of injection holes, and wherein the protruded electrode is an integral part of the first electrode and continuously extends from the edge of the first electrode so as to directly face the second electrode.

16. The semiconductor manufacturing system of claim 15, further comprising a gas outlet above the gas flow control device, wherein the reaction gas is discharged to the outside through the gas discharge path, the gas flow control device, and the gas outlet.

17. The semiconductor manufacturing system of claim 15, wherein the gas flow control device comprises a plate and a sidewall protruding from the plate, and the sidewall comprises a plurality of penetration holes.

18. The semiconductor manufacturing system of claim 15, wherein a first distance between the second electrode and a center region of the first electrode is greater than a second distance between the reactor wall and an edge of the first electrode, and a third distance between the edge of the first electrode and an edge of the second electrode is less than the second distance.

19. The semiconductor manufacturing system of claim 15, wherein the first electrode comprises a protruded electrode adjacent to an edge thereof.

20. The semiconductor manufacturing system of claim 19, wherein the second electrode comprises a recess region to accommodate a substrate, and the recess region extends to a position corresponding to a position where the protruded electrode is located.

21. The semiconductor manufacturing system of claim 1, wherein the protruded electrode is positioned between the plurality of injection holes and the substrate accommodating device.

* * * * *

UNITED STATES PATENT AND TRADEMARK OFFICE
CERTIFICATE OF CORRECTION

PATENT NO. : 10,358,721 B2
APPLICATION NO. : 15/087736
DATED : July 23, 2019
INVENTOR(S) : Dae Youn Kim, Hie Chul Kim and Hyun Soo Jang Page 1 of 1

It is certified that error appears in the above-identified patent and that said Letters Patent is hereby corrected as shown below:

In the Specification

In Column 8 at Line 35, change "*that*" to --*That*--.

In the Claims

In Column 11 at Line 49, In Claim 1, change "*has*" to --*gas*--.

In Column 12 at Line 27, In Claim 9, change "*plat*" to --*plate*--.

In Column 12 at Line 62, In Claim 14, change "*suppled*" to --*supplied*--.

Signed and Sealed this
Third Day of December, 2019

Andrei Iancu
*Director of the United States Patent and Trademark Office*